(12) United States Patent
Qiang et al.

(10) Patent No.: US 11,367,791 B2
(45) Date of Patent: Jun. 21, 2022

(54) THIN FILM TRANSISTOR AND FABRICATING METHOD THEREOF, ARRAY SUBSTRATE AND DISPLAY DEVICE

(71) Applicant: BOE Technology Group Co., Ltd., Beijing (CN)

(72) Inventors: Zhaohui Qiang, Beijing (CN); Jianhua Du, Beijing (CN); Feng Guan, Beijing (CN); Chunhao Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 150 days.

(21) Appl. No.: 16/473,456

(22) PCT Filed: Sep. 5, 2018

(86) PCT No.: PCT/CN2018/104140
§ 371 (c)(1),
(2) Date: Jun. 25, 2019

(87) PCT Pub. No.: WO2019/134380
PCT Pub. Date: Jul. 11, 2019

(65) Prior Publication Data
US 2020/0381560 A1 Dec. 3, 2020

(30) Foreign Application Priority Data
Jan. 5, 2018 (CN) .......................... 201810010296.3

(51) Int. Cl.
*H01L 29/786* (2006.01)
*H01L 27/12* (2006.01)

(52) U.S. Cl.
CPC ...... *H01L 29/78618* (2013.01); *H01L 27/127* (2013.01); *H01L 27/1222* (2013.01);
(Continued)

(58) Field of Classification Search
CPC ......... H01L 29/78618; H01L 29/78696; H01L 27/1229; H01L 29/66757; H01L 29/78675; H01L 27/1222; H01L 27/127–1285
See application file for complete search history.

(56) References Cited

U.S. PATENT DOCUMENTS 5,703,382 A * 12/1997 Hack ................. H01L 29/78645
257/E27.111
7,723,175 B2 * 5/2010 Fruehauf ................. H01L 21/84
257/E21.624
(Continued)

FOREIGN PATENT DOCUMENTS

CN 105957814 A 9/2016
CN 107359126 A 11/2017
(Continued)

OTHER PUBLICATIONS

First Office Action, including Search Report, for Chinese Patent Application No. 201810010296.3, dated Jun. 8, 2020, 15 pages.
(Continued)

*Primary Examiner* — Aaron J Gray
(74) *Attorney, Agent, or Firm* — Westman, Champlin & Koehler, P.A.

(57) ABSTRACT

The present disclosure provides a thin film transistor, a fabricating method thereof, an array substrate, and a display device. The thin film transistor includes: a substrate; a channel region; a heavily doped first semiconductor pattern located on both sides of the channel region; a second semiconductor pattern disposed on the heavily doped first semiconductor pattern; a gate insulating layer covering the channel region and the second semiconductor pattern; a gate pattern disposed on the gate insulating layer, an orthographic projection of the gate pattern on the substrate being within an orthographic projection of the channel region on the
(Continued)

substrate; and a source pattern and a drain pattern in contact with the heavily doped first semiconductor pattern through the first via and the second via, respectively.

14 Claims, 10 Drawing Sheets

(52) U.S. Cl.
CPC ...... *H01L 27/1229* (2013.01); *H01L 27/1274* (2013.01); *H01L 27/1285* (2013.01); *H01L 29/78696* (2013.01)

(56) References Cited

U.S. PATENT DOCUMENTS

| | | | | |
|---|---|---|---|---|
| 8,039,844 | B2* | 10/2011 | Tsai | H01L 29/78648 257/E29.291 |
| 2004/0077133 | A1* | 4/2004 | Battersby | H01L 29/66757 438/149 |
| 2005/0173763 | A1 | 8/2005 | Takeguchi et al. | |
| 2009/0184321 | A1* | 7/2009 | Tsai | H01L 29/78648 257/66 |
| 2014/0284593 | A1* | 9/2014 | Nakano | H01L 29/66969 257/43 |
| 2017/0229584 | A1* | 8/2017 | Okada | H01L 21/02592 |

FOREIGN PATENT DOCUMENTS

| | | |
|---|---|---|
| CN | 108198864 A | 6/2018 |
| JP | H0878697 A | 3/1996 |
| JP | 2005340410 A | 12/2005 |

OTHER PUBLICATIONS

International Search Report and Written Opinion (including English translation of search report and Box V of the Written Opinion) for International Application No. PCT/CN2018/104140, dated Nov. 14, 2018, 14 pages.

* cited by examiner

FIG. 6I

THIN FILM TRANSISTOR AND FABRICATING METHOD THEREOF, ARRAY SUBSTRATE AND DISPLAY DEVICE

CROSS-REFERENCE TO RELATED APPLICATION(S)

This application is a Section 371 National Stage application of International Application No. PCT/CN2018/104140, filed Sep. 5, 2018, which has not yet published, and claims priority to Chinese Patent Application No. 201810010296.3, entitled "Thin film transistor and fabricating method thereof, array substrate and display device" and filed on Jan. 5, 2018, the contents of which are incorporated herein by reference in their entireties.

TECHNICAL FIELD

The present disclosure relates to the field of display, and in particular to a thin film transistor and a fabricating method thereof, an array substrate, and a display device.

BACKGROUND

In the display panel technology, as the display resolution is continuously increased, the size of each transistor in the display panel is continuously reduced, and such a change in size affects the electrical properties of the transistor. For example, as the size of the display unit decreases, the length of the channel region becomes shorter, the influence of the gate of the transistor on the heavily doped region on both sides of the channel region becomes larger, and the short channel effect in the channel region becomes more obvious. This will seriously affect the performance of the display panel.

SUMMARY

The present disclosure proposes a thin film transistor and a fabricating method thereof, an array substrate, and a display device.

According to an aspect of the present disclosure, a thin film transistor is proposed. The thin film transistor includes: a channel region disposed on a substrate; a heavily doped first semiconductor pattern located on both sides of the channel region; a second semiconductor pattern disposed on the heavily doped first semiconductor pattern; a gate insulating layer covering the channel region and the second semiconductor pattern; a gate pattern disposed on the gate insulating layer, an orthographic projection of the gate pattern on the substrate being within an orthographic projection of the channel region on the substrate; and a source pattern and a drain pattern in contact with the heavily doped first semiconductor pattern through the first via and the second via, respectively.

In some embodiments, the transistor further includes a buffer layer located between the heavily doped first semiconductor pattern and the channel region, and the substrate.

In some embodiments, the transistor further includes a dielectric layer covering the gate pattern.

In some embodiments, the material of the heavily doped first semiconductor pattern and the channel region includes polysilicon, and the material of the second semiconductor pattern includes amorphous silicon.

In some embodiments, the channel region has a length of 2-3 μm.

In some embodiments, the gate pattern has a cross section of an inverted trapezoid.

According to another aspect of the present disclosure, an array substrate is provided. The array substrate includes the thin film transistor according to any of the above embodiments.

According to another aspect of the present disclosure, a display device is provided. The display device includes the array substrate according to the above embodiment.

According to still another aspect of the present disclosure, a fabricating method of a thin film transistor is provided. The fabricating method includes: forming a channel region on a substrate; forming a heavily doped first semiconductor pattern on both sides of the channel region; forming a second semiconductor pattern on the first semiconductor pattern; forming a gate insulating layer covering the channel region and the second semiconductor pattern; forming a gate pattern on the gate insulating layer, an orthographic projection of the gate pattern on the substrate being within an orthographic projection of the channel region on the substrate; forming a first via and a second via; and forming a source pattern and a drain pattern, the source pattern and the drain pattern being in contact with the heavily doped first semiconductor pattern through the first via and the second via, respectively.

In some embodiments, said forming the channel region, said forming the heavily doped first semiconductor pattern on both sides of the channel region, and said forming the second semiconductor pattern include: forming a first semiconductor layer on the substrate; heavily doping the first semiconductor layer; forming an opening at a predetermined location of the first semiconductor layer to form the heavily doped first semiconductor pattern; forming a second semiconductor layer on the heavily doped first semiconductor pattern, wherein the second semiconductor layer covers the opening; crystallizing a portion of the second semiconductor layer located at the opening to form the channel region, and forming the second semiconductor pattern by an uncrystallized portion of the second semiconductor layer.

In some embodiments, said forming the channel region, said forming the heavily doped first semiconductor pattern on both sides of the channel region, and said forming the second semiconductor pattern include: forming a first semiconductor layer on the substrate; forming an opening at a predetermined location of the first semiconductor layer to form a first semiconductor pattern; heavily doping the first semiconductor pattern to form the heavily doped first semiconductor pattern; forming a second semiconductor layer on the heavily doped first semiconductor pattern, wherein the second semiconductor layer covers the opening; crystallizing a portion of the second semiconductor layer located at the opening to form the channel region, and forming the second semiconductor pattern by an uncrystallized portion of the second semiconductor layer.

In some embodiments, said forming the channel region, said forming the heavily doped first semiconductor pattern on both sides of the channel region, and said forming the second semiconductor pattern include: forming a first semiconductor layer on the substrate; heavily doping a portion of the first semiconductor layer to form the channel region and the heavily doped first semiconductor pattern, wherein the heavily doped first semiconductor pattern is located on both sides of the channel region; forming a second semiconductor layer on the heavily doped first semiconductor pattern and the channel region; removing a portion of the second semiconductor layer located on the channel region to form the second semiconductor pattern.

In some embodiments, before forming the first semiconductor layer, the method further includes forming a buffer layer on the substrate.

In some embodiments, before forming the first via and the second via, the method further includes forming a dielectric layer covering the gate pattern.

In some embodiments, a material of the heavily doped first semiconductor pattern includes polysilicon, a material of the second semiconductor pattern includes amorphous silicon, and a material of the channel region includes polysilicon.

In some embodiments, the channel region has a length of 2-3 μm.

In some embodiments, the gate pattern has a cross section of an inverted trapezoid.

DETAILED DESCRIPTION

In order to make the purpose, technical solutions and advantages of the embodiments of the present disclosure more clear, the technical solutions in the embodiments of the present disclosure will be clearly and completely described below in conjunction with the drawings in the embodiments of the present disclosure. It is apparent that the described embodiments are part of the embodiments of the present disclosure, and not all. All other embodiments obtained by a person of ordinary skill in the art based on the described embodiments of the present disclosure without creative effort should fall within the protection scope of the present disclosure. It should be noted that the same elements are denoted by the same or similar reference numerals throughout the drawings. In the following description, some specific embodiments are for illustrative purposes only, and should not be considered as limiting the disclosure, but only examples of embodiments of the present disclosure. Conventional structures or configurations will be omitted if otherwise they would cause confusion to the understanding of the present disclosure. It should be noted that the shapes and scales of the various components in the drawings are not drawn to the true shapes and scales, but merely illustrate the contents of the embodiments of the present disclosure.

Technical or scientific terms used in the embodiments of the present disclosure should be of ordinary meaning as understood by those skilled in the art, unless otherwise defined. The terms "first", "second" and similar words used in the embodiments of the present disclosure do not denote any order, quantity, or importance, but are merely used to distinguish different components.

Further, in the description of the embodiments of the present disclosure, the term "A on B" or "A on both sides of B" may indicate that A and B are in direct contact with each other, or that A and B have indirect position relationships via one or more other intermediate components.

According to an embodiment of the present disclosure, a thin film transistor is proposed. The thin film transistor includes: a channel region disposed on a substrate; a heavily doped first semiconductor pattern located on both sides of the channel region; a second semiconductor pattern disposed on the heavily doped first semiconductor pattern; a gate insulating layer covering the channel region and the second semiconductor pattern; a gate pattern disposed on the gate insulating layer, an orthographic projection of the gate pattern on the substrate being within an orthographic projection of the channel region on the substrate; and a source pattern and a drain pattern in contact with the heavily doped first semiconductor pattern through the first via and the second via, respectively.

According to an embodiment of the present disclosure, a fabricating method of a thin film transistor is also proposed. The fabricating method includes: forming a channel region on a substrate; forming a heavily doped first semiconductor pattern on both sides of the channel region; forming a second semiconductor pattern on the first semiconductor pattern; forming a gate insulating layer covering the channel region and the second semiconductor pattern; forming a gate pattern on the gate insulating layer, an orthographic projection of the gate pattern on the substrate being within an orthographic projection of the channel region on the substrate; forming a first via and a second via; forming a source pattern and a drain pattern, the source pattern and the drain pattern being in contact with the heavily doped first semiconductor pattern through the first via and the second via, respectively.

The present disclosure is specifically described below with reference to the accompanying drawings.

Figure 1:
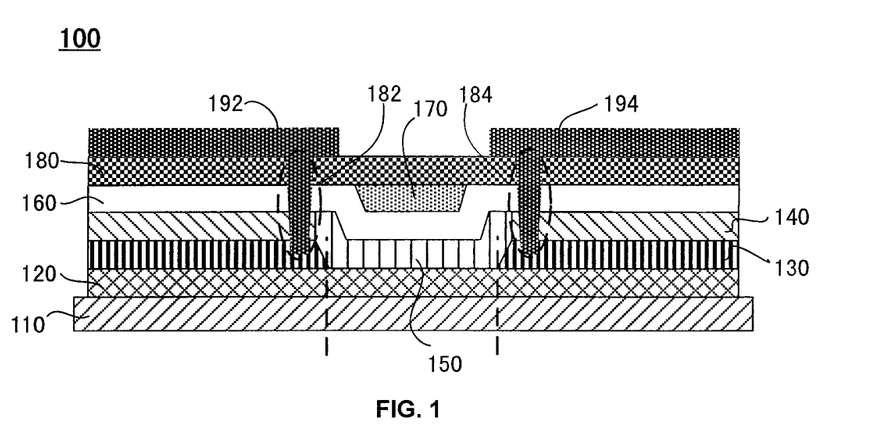
FIG. 1 shows a schematic cross-sectional view of a thin film transistor in accordance with an embodiment of the present disclosure.

FIG. 1 shows a schematic cross-sectional view of a thin film transistor 100 in accordance with an embodiment of the present disclosure.

As can be seen from FIG. 1, the thin film transistor 100 includes a buffer layer 120 disposed on a substrate 110, a first semiconductor pattern 130, a second semiconductor pattern 140, a channel region 150, a gate insulating layer 160, a gate pattern 170, a dielectric layer 180, a source pattern 192, and a drain pattern 194.

Specifically, the material of the substrate 110 may be glass, polyimide, plastic, silicon, or the like. In some embodiments, in the case where the location of the thin film transistor to be formed on the substrate 110 is predetermined, the substrate 110 may be divided into a first area for forming the heavily doped region and a second area for forming the channel region, and the corresponding deposition process may be performed according to the divided areas. In FIG. 1, the division of the first area and the second area is shown with two vertical broken lines, wherein the portion between the two broken lines in the figure is the second area, and the remaining portion is the first area. It should be noted that FIG. 1 illustrates only the structure of a single thin film transistor, and when a plurality of thin film transistors are formed on the substrate, the first area and the second area may be alternately arranged.

The buffer layer 120 is disposed on the substrate 110. It should be understood that in some embodiments, the buffer layer 120 may be omitted or replaced by other layer structures or patterns.

The first semiconductor pattern 130 is disposed on the buffer layer 120. In some embodiments, the first semiconductor pattern 130 is heavily doped polysilicon (p-Si). It should be noted that, the ions used herein in the heavy doping process include, but are not limited to, any Group III and Group V element ions suitable for semiconductor doping of silicon, such as boron ions. In addition, the doping concentration of the heavy doping process is between $1\times10^{14}/cm^3$ and $1\times10^{15}/Cm^3$, for example, $5\times10^{14}/cm^3$.

It should be understood that in the above embodiment in which the buffer layer 120 is omitted, the first semiconductor pattern 130 may be directly disposed on the substrate 110.

The second semiconductor pattern 140 is disposed on the first semiconductor pattern 130. In some embodiments, an orthographic projection of the second semiconductor pattern 140 on the substrate is within an orthographic projection of the first semiconductor pattern 130 on the substrate. The second semiconductor pattern 140 is amorphous silicon (a-Si).

The channel region 150 is disposed on the buffer layer 120 adjacent to the first semiconductor pattern 130, wherein the first semiconductor pattern 130 is located on both sides of the channel region 150. In some embodiments, the channel region 150 is polysilicon (p-Si) without being heavily doped. It should be understood that in the above embodiment in which the buffer layer 120 is omitted, the channel region 150 is disposed directly on the substrate 110.

It is to be noted that, in the embodiment shown in FIG. 1, a portion of the channel region 150 is located in the layer in which the second semiconductor pattern 140 is located, and the channel region 150 is in contact with the second semiconductor pattern 140 through that portion. In order to achieve such a structure, in the process of actually fabricating the thin film transistor 100 shown in FIG. 1, the first semiconductor pattern 130 may be first formed and heavily doped, and then the second semiconductor pattern 140 and the channel region 150 may be further formed by one patterning. Thus, the channel region 150 is not affected by the heavy doping in the first semiconductor pattern 130, and the short channel effect can be suppressed.

The gate insulating layer 160 is disposed on the channel region 150 and the second semiconductor pattern 140.

The gate pattern 170 is disposed on the gate insulating layer 160, and an orthographic projection of the gate pattern 170 on the substrate 110 is within an orthographic projection of the channel region 150 on the substrate 110.

It is to be noted that, in the embodiment shown in FIG. 1, due to the presence of the second semiconductor pattern 140, the formed gate insulating layer 160 has an opening located in the second area, and thus the gate pattern 170 may be formed in the opening, and the formed gate pattern 170 has a cross section having a shape of an inverted trapezoid (that is, the upper base of the trapezoid is longer than the lower base of the trapezoid), rather than a shape of a forward trapezoid. This is advantageous in reducing the influence of the gate pattern 170 on the heavily doped first semiconductor pattern 130.

In some embodiments, the gate pattern 170 forms a flat surface with the gate insulating layer 160 (that is, the upper surface of the gate pattern 170 is flush with the upper surface of the gate insulating layer 160 in FIG. 1).

The dielectric layer 180 covers the gate pattern 170 and the gate insulating layer 160. It should be understood that in some embodiments, the dielectric layer 180 may be omitted, or the dielectric layer 180 may be replaced by other layer structures or patterns.

The source pattern 192 and the drain pattern 194 are disposed on two sides of the gate pattern 170, respectively. Specifically, in the thin film transistor 100, a first via 182 and a second via 184 are formed on two sides of the gate pattern 170, respectively. The source pattern 192 and the drain pattern 194 are disposed on the dielectric layer 180 and are in contact with the first semiconductor pattern 130 through the first via 182 and the second via 184, respectively.

Figure 2:
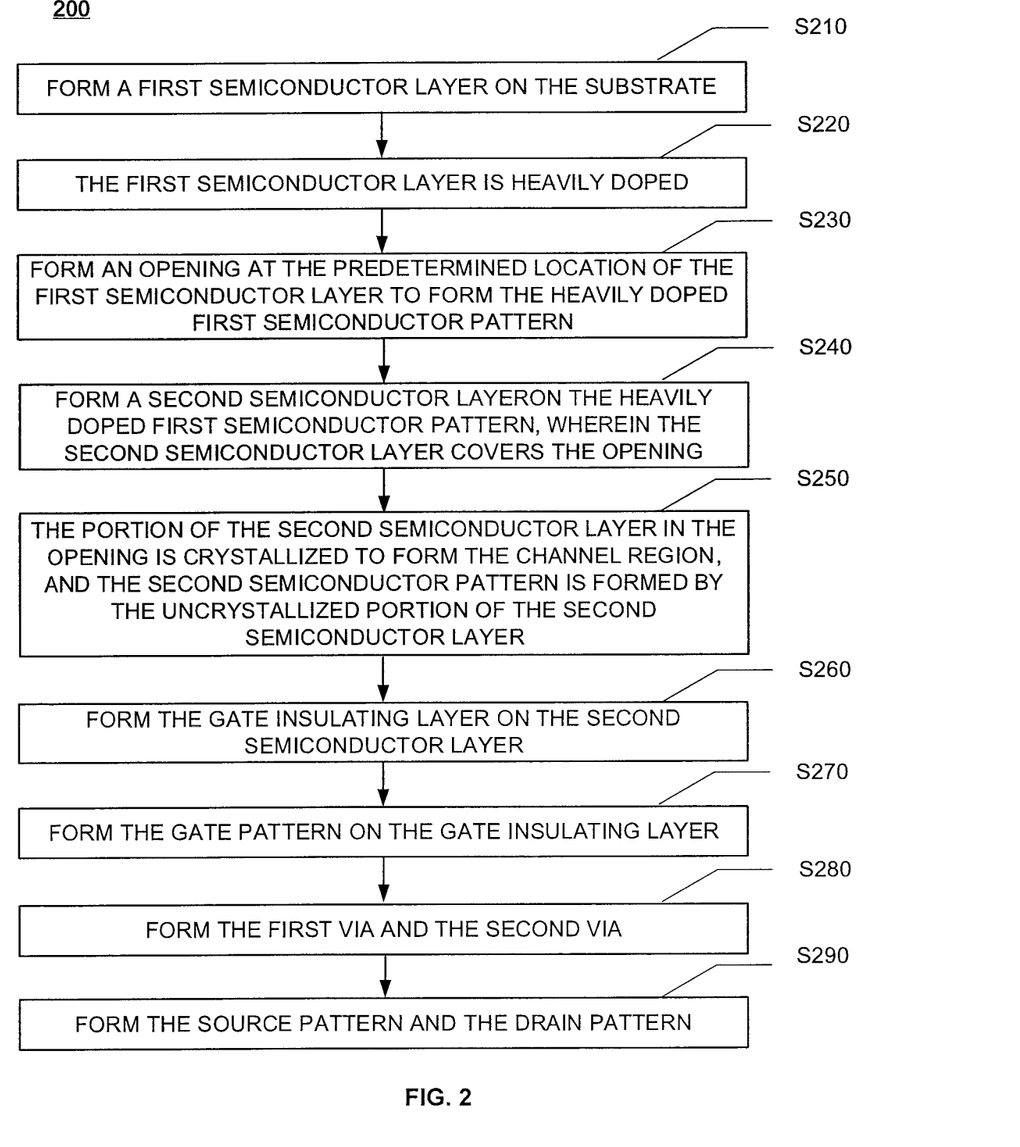
FIG. 2 shows a flow chart of a fabricating method of the transistor shown in FIG. 1.

FIG. 2 shows a flow chart of a fabricating method 200 of the thin film transistor 100 shown in FIG. 1. FIGS. 3A-3J show schematic cross-sectional views of different stages in the fabricating method of the thin film transistor 100 shown in FIG. 1. The respective steps of the fabricating method 200 shown in FIG. 2 will be described below with reference to FIGS. 3A-3J. It is to be noted that, S210-S250 in the following method illustrate the step of forming the channel region, the step of forming the heavily doped first semiconductor pattern on both sides of the channel region, and the step of forming the second semiconductor pattern in the fabricating method of the thin film transistor according to the embodiment of the present disclosure as described above.

In step S210, a first semiconductor layer is formed on the substrate.

Figure 3A:
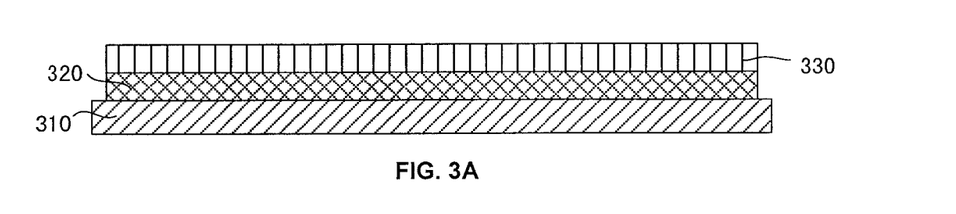
FIGS. 3A-3J show schematic cross-sectional views of different stages in the fabricating method of the transistor shown in FIG. 1.

Referring to FIG. 3A, a first semiconductor layer 330 is formed on the substrate 310. A buffer layer 320 on the substrate 310 is also formed in FIG. 3A, and the first semiconductor layer 330 is illustrated as being indirectly formed on the substrate 310 through the buffer layer 320. However, it should be understood that in other embodiments, the buffer layer 320 may be omitted and the first semiconductor layer 330 may be disposed directly on the substrate 310.

Specifically, the substrate 310 may be a glass substrate; the buffer layer 320 may be $SiN_x$ and/or $SiO_2$; the first semiconductor layer 330 may be a polysilicon layer, which may be obtained by first depositing amorphous silicon and then performing the process of crystallization (for example, by melt laser annealing (MLA)). For example, the thickness of the first semiconductor layer 330 may be 40-50 μm.

In step S220, the first semiconductor layer is heavily doped.

Figure 3B:
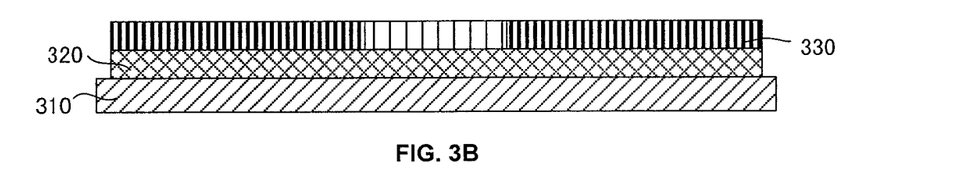

Referring to FIG. 3B, a portion of the first semiconductor layer 330 (two sides of the first semiconductor layer 330 shown with dense vertical lines) has been heavily doped. It should be noted that the heavily doped portion shown in the figure is merely an example, and more (all) or less portions of the first semiconductor layer 330 may be heavily doped in other embodiments. For example, only the locations in which a source via and a drain via are to be formed may be heavily doped according to the design. As another example, the entire first semiconductor layer 330 may be heavily doped.

In step S230, an opening is formed at the predetermined location of the first semiconductor layer to form the heavily doped first semiconductor pattern.

Figure 3C:
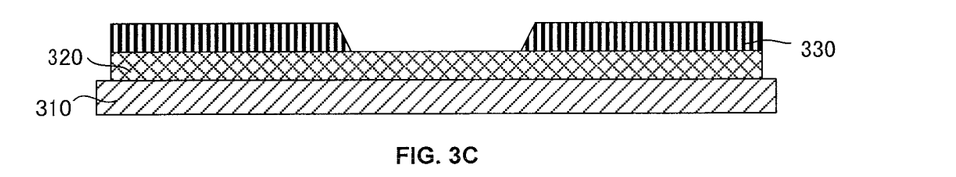

Referring to FIG. 3C, the middle portion of the first semiconductor layer 330 is etched to form the opening, and both ends of the opening are located in the above-mentioned heavily doped portion. For example, the length of the opening may be 2-3 μm. The location at which the opening is formed is the location that will be used to form the channel region according to the design.

It should be noted that in other embodiments, steps S220 and S230 may be performed in an inverse order. That is, the opening may be first formed in the first semiconductor layer to form the first semiconductor pattern, and then the rest of the first semiconductor layer may be heavily doped to form the heavily doped first semiconductor pattern.

Referring to FIG. 3B', in other embodiments, the opening is first formed by etching at the predetermined location (for example, the middle portion, depending on the location to be used for forming the channel region) of the first semiconductor layer 330 to form the first semiconductor pattern; then the formed first semiconductor pattern is heavily doped to obtain the structure shown in FIG. 3C.

It should be understood that regardless of which of the above embodiments is used to form the structure shown in FIG. 3C, the effect of heavy doping is strictly limited to the first semiconductor pattern, without affecting the channel region to be formed later, thereby suppressing the short channel effect.

Next, in step S240, a second semiconductor layer is formed on the first semiconductor pattern, wherein the second semiconductor layer covers the opening.

Figure 3D:
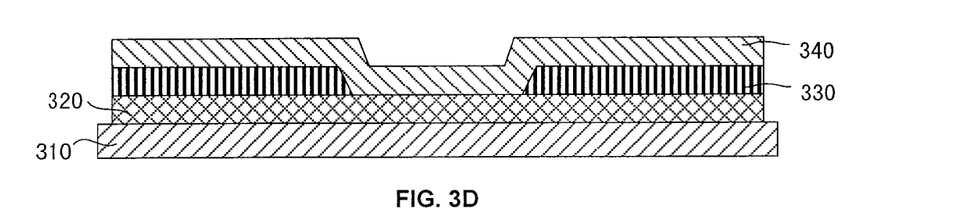

Referring to FIG. 3D, a second semiconductor layer 340 is further deposited on the first semiconductor pattern, and the second semiconductor layer 340 also covers the opening. Specifically, the second semiconductor layer 340 is an amorphous silicon layer having a thickness of, for example, 40-50 μm.

In step S250, the portion of the second semiconductor layer located in the opening is crystallized to form the channel region (polysilicon (p-Si)), and a second semiconductor pattern is formed by the uncrystallized portion of the second semiconductor layer.

Figure 3E:
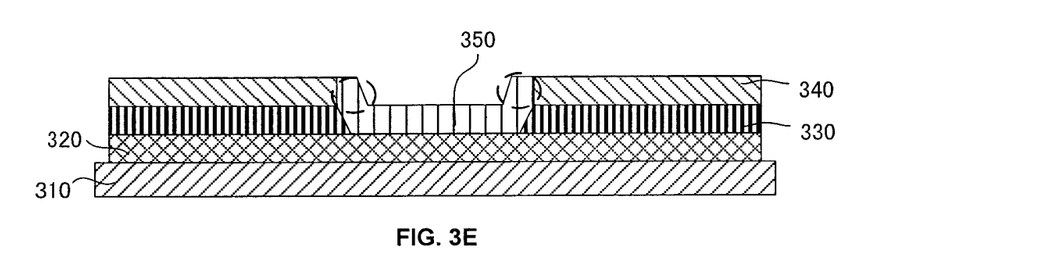

Referring to FIG. 3E, the portion of the second semiconductor layer 340 located in the opening is crystallized (for example, selectively crystallized by MLA) to form the channel region 350, and a second semiconductor pattern is formed by the uncrystallized portion of the second semiconductor layer 340. It is to be noted that in the process of crystallizing the portion of the second semiconductor layer 340 in the opening, the turns of the second semiconductor layer 340 (that is, two places shown with the dashed circles in FIG. 3E) may also be crystallized. In the structure of FIG. 3E, the so formed channel region is in sufficient contact with the heavily doped first semiconductor layer 330.

In step S260, the gate insulating layer covering the channel region and the second semiconductor pattern is formed.

Figure 3F:
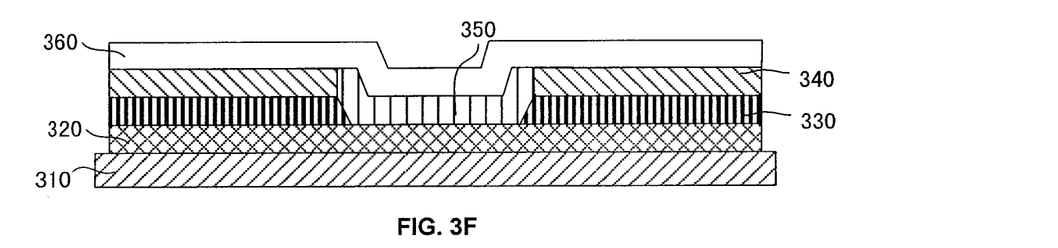

Referring to FIG. 3F, the gate insulating layer 360 is formed on the second semiconductor layer 340.

In step S270, the gate pattern is formed on the gate insulating layer.

Figure 3G:
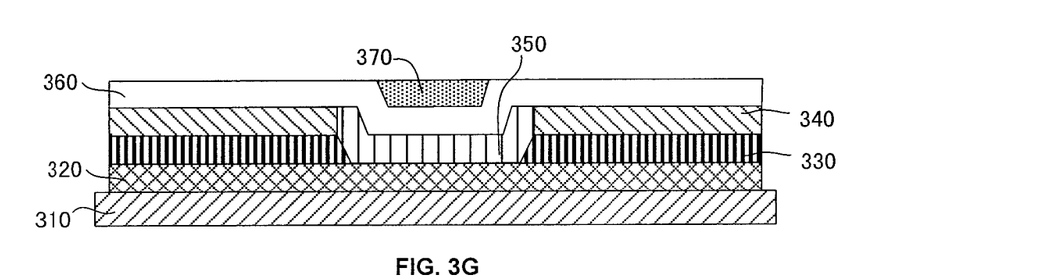

Referring to FIG. 3G, the gate pattern 370 is formed on the gate insulating layer 360. In some embodiments, the orthographic projection of the gate pattern 370 on the substrate 310 is within the orthographic projection of the channel region 350 on the substrate 310.

Specifically, a gate layer may be first formed on the gate insulating layer 360, and then is subject to subsequent processing such as photolithography, ashing and the like, to form the gate pattern 370. The length of the gate pattern 370 is, for example, 1.5-2 μm.

In some embodiments, the gate insulating layer 360 and the gate pattern 370 form a flat surface.

It should be noted that, in the structure shown in FIG. 3G, the cross section of the formed gate pattern 370 is an inverted trapezoid due to the introduction of the second semiconductor pattern, which is advantageous in reducing the driving of the carriers on both sides of the channel region 350 by the electric field generated by the gate pattern 370. In addition, the effective channel in the structure shown in FIG. 3G is longer, which is advantageous in reducing the off-state current, thereby suppressing the short channel effect.

Next, in step S280, the first via and the second via are formed on two sides of the gate pattern, respectively.

In some embodiments, a dielectric layer is formed on the gate insulating layer and the gate pattern prior to forming the first via and the second via.

Figure 3H:
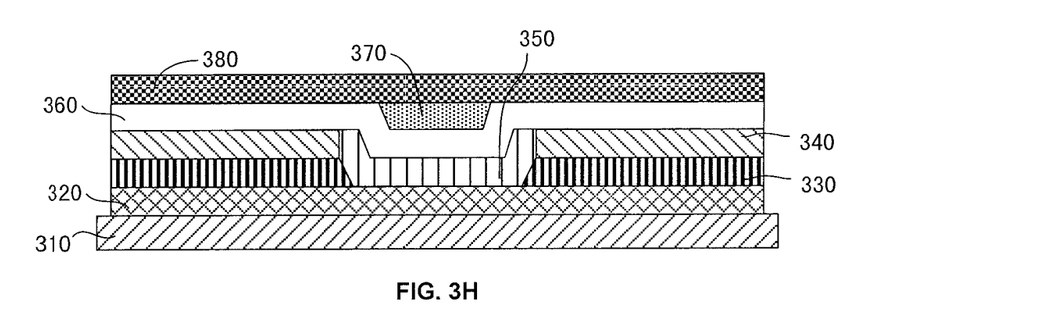
Figure 3I:
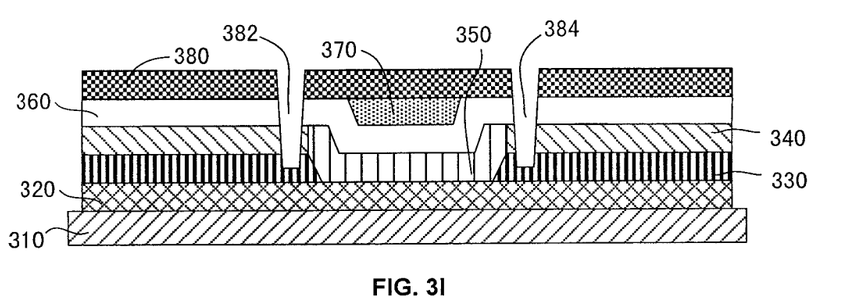

Referring to FIGS. 3H and 3I, the dielectric layer 380 is first formed on the gate insulating layer 360 and the gate pattern 370, and then the first via 382 and the second via 384 are formed on two sides of the gate pattern 370, respectively. The first via 382 and the second via 384 penetrate the dielectric layer 380, the gate insulating layer 360, and the second semiconductor layer 340, and expose the first semiconductor pattern.

In step S290, the source pattern and the drain pattern are formed, and the source pattern and the drain pattern are in contact with the heavily doped first semiconductor pattern through the first via 382 and the second via 384, respectively.

Figure 3J:
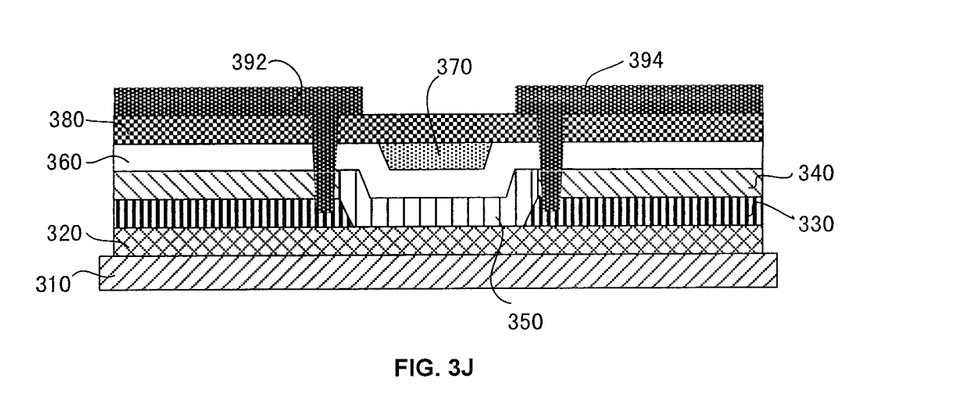

Referring to FIG. 3J, the source pattern 392 and the drain pattern 394 are formed on the dielectric layer 380, and the source pattern 392 and the drain pattern 394 respectively protrude into the first via 382 and the second via 384 to be in contact with the first semiconductor pattern.

The method 200 for forming the thin film transistor according to FIG. 2 has been described above in connection with FIGS. 3A-3J. It should be understood that the method steps described above are merely examples, and other embodiments may include more or fewer steps.

Figure 4:
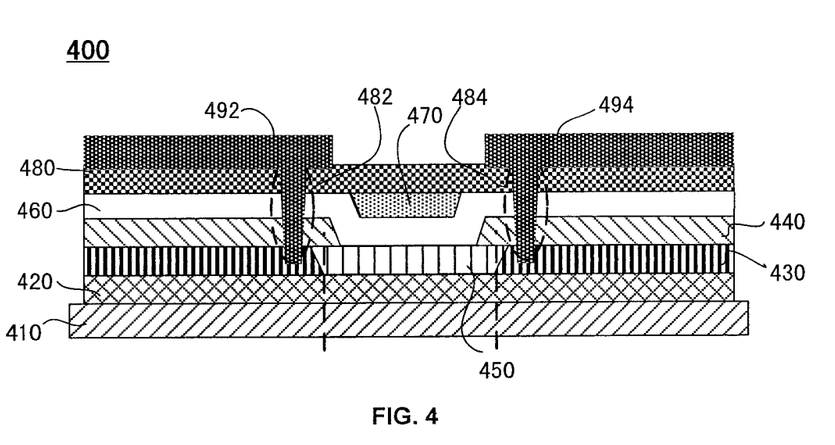
FIG. 4 shows a schematic cross-sectional view of a thin film transistor in accordance with another embodiment of the present disclosure.

FIG. 4 shows a schematic cross-sectional view of a thin film transistor 400 in accordance with another embodiment of the present disclosure.

As can be seen from FIG. 4, the thin film transistor 400 includes a buffer layer 420 disposed on a substrate 410, a first semiconductor pattern 430, a second semiconductor pattern 440, a channel region 450, a gate insulating layer 460, a gate pattern 470, a dielectric layer 480, a source pattern 492, and a drain pattern 494.

In some embodiments, in the case where the location of the thin film transistor to be formed on the substrate 410 is predetermined, the substrate 410 may be divided into a first area for forming the heavily doped region and a second area for forming the channel region, and the corresponding deposition process may be performed according to the divided areas. In FIG. 4, the division of the first area and the second area is shown with two vertical broken lines, wherein the portion between the two broken lines in the figure is the second area, and the remaining portion is the first area. It should be noted that FIG. 4 illustrates only the structure of a single thin film transistor, and when a plurality of thin film transistors are formed on the substrate, the first area and the second area may alternately appear.

The buffer layer 420 is disposed on the substrate 410. It should be understood that in some embodiments, the buffer layer 420 may be omitted, or the buffer layer 420 may be replaced by other layer structures or patterns.

The first semiconductor pattern 430 is disposed on the buffer layer 420. In some embodiments, the first semiconductor pattern 430 is heavily doped polysilicon (p-Si). It should be understood that in the above embodiment in which the buffer layer 420 is omitted, the first semiconductor pattern 430 may be directly disposed on the substrate 410.

The second semiconductor pattern 440 is disposed on the first semiconductor pattern 430. In some embodiments, the orthographic projection of the second semiconductor pattern 440 on the substrate is within the orthographic projection of the first semiconductor pattern 430 on the substrate, and the second semiconductor pattern 440 is amorphous silicon (a-Si).

The channel region 450 is disposed on the buffer layer 420 adjacent to the first semiconductor pattern 430, wherein the first semiconductor pattern 430 is located on both sides of the channel region 450. In some embodiments, the channel region 450 is polysilicon (p-Si) without being heavily doped. It should be understood that in the above embodiment in which the buffer layer 420 is omitted, the channel region 450 is disposed directly on the substrate 410.

It should be noted that in the embodiment shown in FIG. 4, the channel region 450 is completely located in the layer in which the first semiconductor pattern 430 is located. In order to achieve such a structure, in the process of actually fabricating the thin film transistor 400 shown in FIG. 4, the first semiconductor pattern 430 and the channel region 450 may be formed by one patterning. That is, the channel region 450 is formed together with the first semiconductor pattern 430, and then the second semiconductor pattern 440 is formed. Since the channel region 450 is formed together with the first semiconductor pattern 430, only one crystallization process is required, and thus, the embodiment shown in FIG. 4 is simpler in process than the embodiment shown in FIG. 1.

It should also be noted that although the second semiconductor pattern 440 is illustrated in FIG. 4 as partially covering the channel region 450, in other embodiments, the second semiconductor pattern 440 may not be in contact/overlap with the channel region 450.

The gate insulating layer 460 is disposed on the channel region 450 and the second semiconductor pattern 440.

The gate pattern 470 is disposed on the gate insulating layer 460, and the orthographic projection of the gate pattern 470 on the substrate 410 is within the orthographic projection of the channel region 450 on the substrate 410.

It should be noted that, in the embodiment shown in FIG. 4, due to the presence of the second semiconductor pattern 440, the gate pattern 470 may be formed in the opening of the gate insulating layer 460 located in the second area, and the gate pattern 470 has a cross section having a shape of an inverted trapezoid (that is, the upper base of the trapezoid is longer than the lower base of the trapezoid), rather than a shape of a forward trapezoid. This is advantageous in reducing the influence of the gate pattern 470 on the heavily doped first semiconductor pattern 430.

In some embodiments, the gate pattern 470 forms a flat surface with the gate insulating layer 460 (that is, the upper surface of the gate pattern 470 is flush with the upper surface of the gate insulating layer 460 in FIG. 4).

The dielectric layer 480 covers the gate pattern 470 and the gate insulating layer 460. It should be understood that in some embodiments, the dielectric layer 480 may be omitted, or the dielectric layer 480 may be replaced by other layer structures or patterns.

The source pattern 492 and the drain pattern 494 are respectively disposed on two sides of the gate pattern 470. Specifically, in the thin film transistor 400, a first via 482 and a second via 484 are formed on two sides of the gate pattern 470, respectively. The source pattern 492 and the drain pattern 494 are disposed on the dielectric layer 480 and are in contact with the first semiconductor pattern 430 through the first via 482 and the second via 484, respectively.

Figure 5:
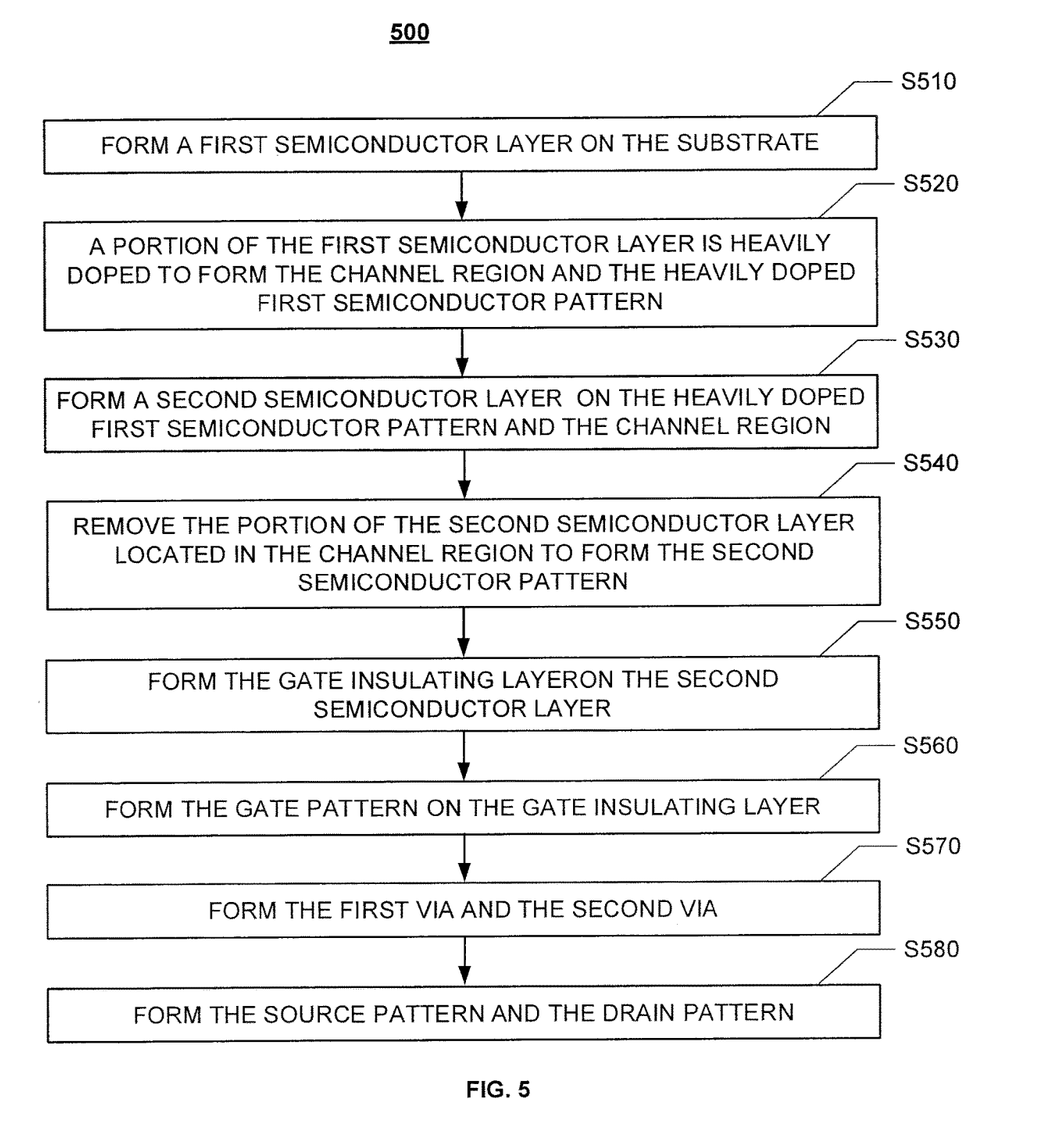
FIG. 5 shows a flow chart of a fabricating method of the transistor shown in FIG. 4.

FIG. 5 shows a flow chart of a fabricating method 500 of the thin film transistor 400 shown in FIG. 4. FIGS. 6A-6I show schematic cross-sectional views of different stages in the fabricating method of the thin film transistor 400 shown in FIG. 4. The respective steps of the fabricating method 500 shown in FIG. 5 will be described below with reference to FIGS. 6A-6I. It is to be noted that S510-S540 in the following method illustrate the step of forming the channel region, the step of forming the heavily doped first semiconductor pattern on both sides of the channel region, and the step of forming the second semiconductor pattern in the fabricating method of the thin film transistor according to the embodiment of the present disclosure as described above.

In step S510, a first semiconductor layer is formed on the substrate.

Figure 6A:
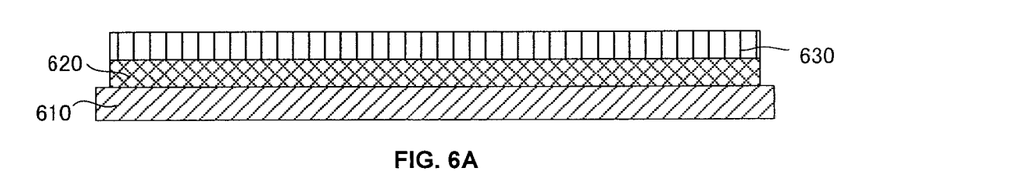
FIGS. 6A-6I show schematic cross-sectional views of different stages in the fabricating flow of the transistor shown in FIG. 4.

Referring to FIG. 6A, a first semiconductor layer 630 is formed on the substrate 610. A buffer layer 620 is also formed on the substrate 610 in FIG. 6A, and the first semiconductor layer 630 is illustrated as being indirectly formed on the substrate 610 through the buffer layer 620. However, it should be understood that in other embodiments, the buffer layer 620 may be omitted and the first semiconductor layer 630 may be disposed directly on the substrate 610.

Specifically, the material of the substrate 610 may be glass, polyimide, plastic, silicon, and the like; the buffer layer 620 may be $SiN_x$ and/or $SiO_2$; the first semiconductor layer 630 may be a polysilicon layer, which may be obtained by first depositing amorphous silicon and then performing the process of crystallization (for example, by melt laser annealing (MLA)). For example, the thickness of the first semiconductor layer 330 may be 40-50 μm.

In step S520, a portion of the first semiconductor layer is heavily doped to form the channel region and the heavily doped first semiconductor pattern, wherein the heavily doped first semiconductor pattern is located on both sides of the channel region.

Figure 6B:
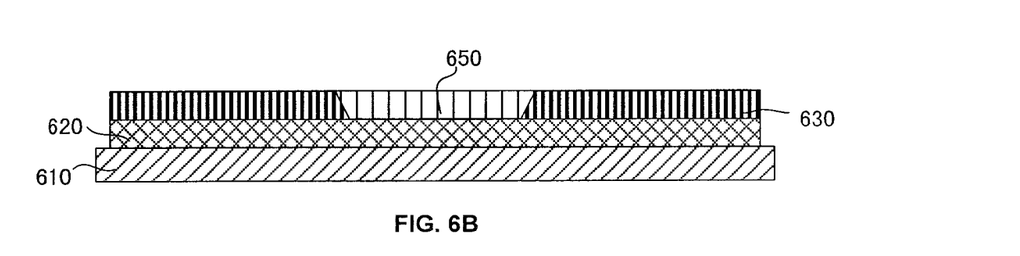

Referring to FIG. 6B, the portion of the first semiconductor layer 630 located at the first area as described above (the portion located at both sides shown with dense vertical lines) is heavily doped to form the heavily doped first semiconductor pattern. The remaining of the first semiconductor layer 630 (between the heavily doped areas) is not heavily doped to form the channel region 650. For example, the length of the channel may be 2-3 μm.

In step S530, a second semiconductor layer is formed on the first semiconductor pattern and the channel region.

Figure 6C:
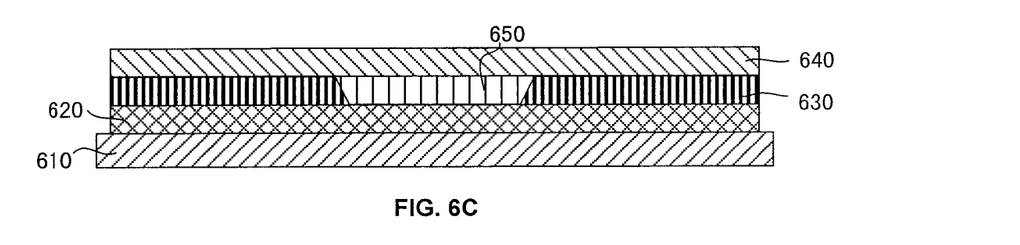

Referring to FIG. 6C, a second semiconductor layer 640 is further deposited on the first semiconductor layer 630 (including the first semiconductor pattern and the channel region 650). Specifically, the second semiconductor layer 640 is an amorphous silicon layer having a thickness of, for example, 40-50 μm.

In step S540, the portion of the second semiconductor layer that is located in the area not heavily doped is removed to form the second semiconductor pattern.

Figure 6D:
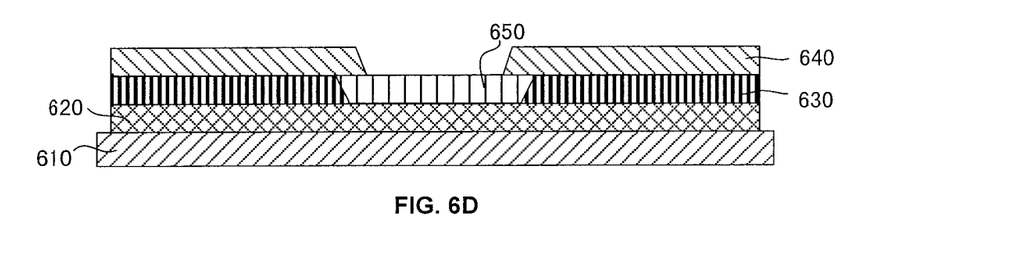

Referring to FIG. 6D, the portion of the second semiconductor layer 640 above the channel region 650 is removed. It should be understood that although the portion of a particular size in the second semiconductor layer 640 is removed in FIG. 6D, this is merely an example, and the size of the portion removed from the second semiconductor layer 640 is not specifically limited in the present application, as long as a gate pattern having a shape of an inverted trapezoid capable of realizing the technical solution of the present application can be formed in the subsequent step. Preferably, the length of the gate pattern is set to be, for example, 1.5-2 μm. A person skilled in the art may set the size of the portion removed from the second semiconductor layer 640 according to the requirements for the length of the gate pattern.

In step S550, the gate insulating layer is formed on the second semiconductor layer.

Figure 6E:
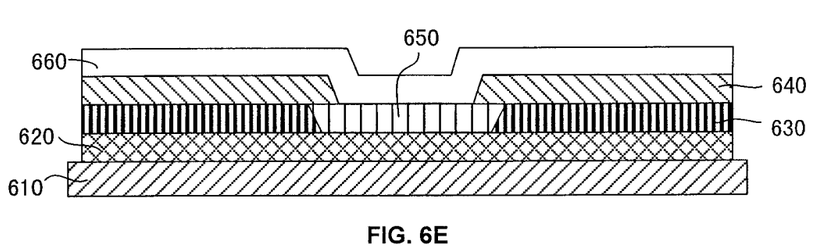

Referring to FIG. 6E, the gate insulating layer 660 is formed on the second semiconductor layer 640.

In step S560, the gate pattern is formed on the gate insulating layer.

Figure 6F:
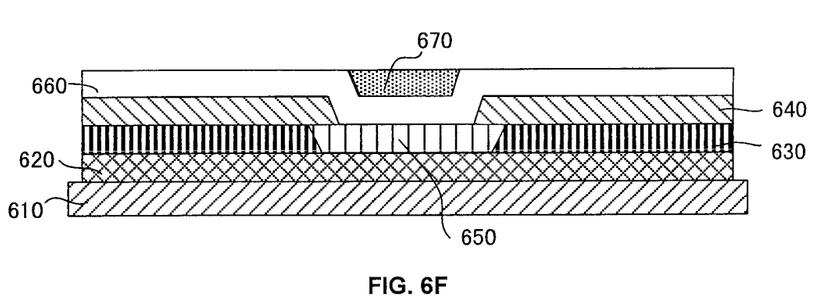

Referring to FIG. 6F, the gate pattern 670 is formed on the gate insulating layer 660. In some embodiments, the orthographic projection of the gate pattern 670 on the substrate 610 is within the orthographic projection of the channel region 650 on the substrate 610.

Specifically, a gate layer may be first formed on the gate insulating layer 660, and then is subject to subsequent processing such as photolithography, ashing and the like, to form the gate pattern 670.

In some embodiments, the gate insulating layer 660 and the gate pattern 670 form a flat surface.

It is to be noted that, in the structure shown in FIG. 6F, the cross section of the formed gate pattern 670 is an inverted trapezoid due to the introduction of the second semiconductor layer 640, which is advantageous in reducing the driving of the carriers on both sides of the channel region 650 by the electric field generated by the gate pattern 670. In addition, the effective channel in the structure shown in FIG. 6F is longer, which is advantageous in reducing the off-state current, thereby suppressing the short channel effect.

Next, in step S570, the first via and the second via are formed on both sides of the gate pattern, respectively.

In some embodiments, a dielectric layer is formed on the gate insulating layer and the gate pattern prior to forming the first via and the second via.

Figure 6G:
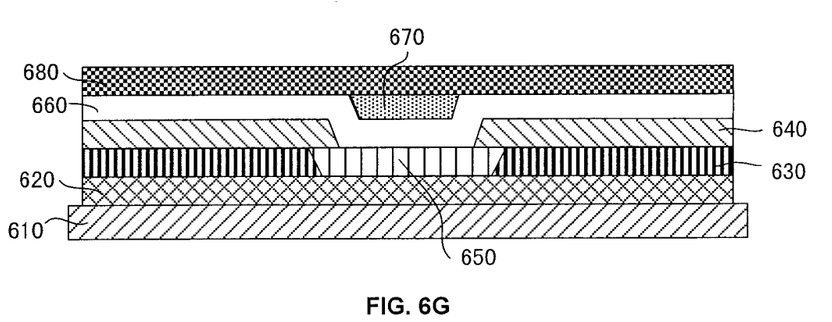
Figure 6H:
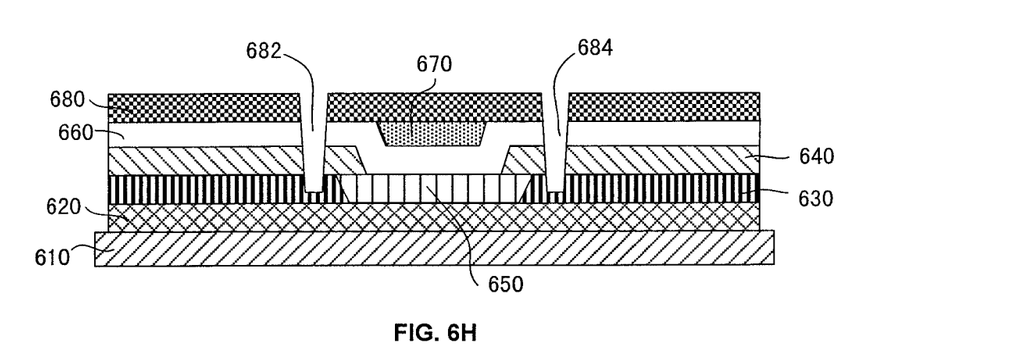

Referring to FIGS. 6G and 6H, the dielectric layer 680 is first formed on the gate insulating layer 660 and the gate pattern 670, and then the first via 682 and the second via 684 are formed on two sides of the gate pattern 670, respectively. The first via 682 and the second via 684 penetrate the dielectric layer 680, the gate insulating layer 660, and the second semiconductor layer 640, and expose the first semiconductor layer 630.

In step S580, the source pattern and the drain pattern are formed, and the source pattern and the drain pattern are in contact with the first semiconductor layer through the first via and the second via, respectively.

Figure 6I:
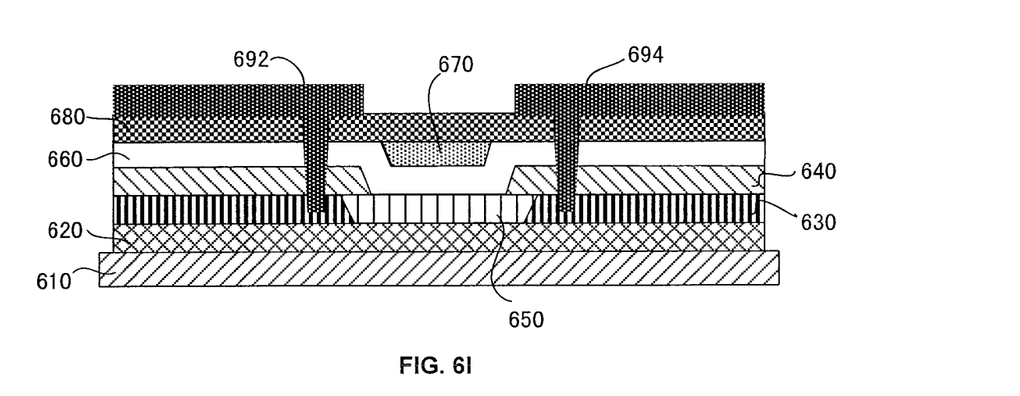

Referring to FIG. 6I, the source pattern 692 and the drain pattern 694 are formed on the dielectric layer 680, and the source pattern 692 and the drain pattern 694 respectively protrude into the first via 682 and the second via 684 to be in contact with the first semiconductor layer 630.

The method 500 for forming the thin film transistor according to FIG. 5 has been described above in connection with FIGS. 6A-6I. It should be understood that the method steps described above are merely examples, and other embodiments may include more or fewer steps.

In addition, an embodiment of the present disclosure also proposes an array substrate. The array substrate includes the thin film transistor according to the above embodiments. Specifically, the thin film transistor may be used as the driving transistor, the display transistor, or the like on the array substrate.

In addition, an embodiment of the present disclosure also proposes a display device including the above array substrate. Specifically, the display device may be a liquid crystal display device such as a liquid crystal panel, a liquid crystal television, a mobile phone, an electronic reader, a liquid crystal display, or the like.

The present disclosure has been described with reference to a few exemplary embodiments, and it should be understood that the terms used are illustrative and exemplary and not for limiting the scope. The present disclosure may be embodied in a variety of forms without departing from the spirit or scope of the disclosure. It is to be understood that the above-described embodiments are not limited to the details of the foregoing, but should be construed broadly within the spirit and scope defined by the appended claims. All changes and modifications that come within the scope of the claims or the equivalents thereof are intended to be covered by the appended claims.

We claim:

1. A thin film transistor comprising:
   a heavily doped first semiconductor pattern on a substrate, having an opening;
   a second semiconductor layer comprising an uncrystallized portion disposed on the heavily doped first semiconductor pattern and a crystallized portion filling the opening, the second semiconductor layer having a surface comprising a recess at the crystallized portion;
   a gate insulating layer covering the second semiconductor layer;
   a gate pattern disposed on the gate insulating layer, an orthographic projection of the gate pattern on the substrate being within an orthographic projection of the opening on the substrate, the gate pattern has a cross section of an inverted trapezoid including a lower base close to the gate insulating layer and an upper base away from the gate insulating layer, and the upper base is longer than the lower base;
   a first via and a second via on two sides of the gate pattern, respectively, wherein the first via and the second via are disposed to penetrate, the gate insulating layer and the second semiconductor layer, and extend to the heavily doped first semiconductor pattern; and
   a source pattern and a drain pattern in contact with the heavily doped first semiconductor pattern through the first via and the second via, respectively,
   wherein the first semiconductor pattern includes dents, a depth of each of the dents is less than a thickness of the first semiconductor pattern, and the source pattern and the drain pattern fill the dents.

2. The thin film transistor of claim 1, further comprising:
   a buffer layer located between the heavily doped first semiconductor pattern and the substrate.

3. The thin film transistor of claim 1, further comprising:
   a dielectric layer covering the gate pattern, and
   wherein the source pattern and the drain pattern are formed on the dielectric layer.

4. The thin film transistor of claim 1, wherein a material of the heavily doped first semiconductor pattern comprises polysilicon, and a material of the uncrystallized portion comprises amorphous silicon.

5. The thin film transistor of claim 1, wherein the opening has a length of 2-3 µm.

6. An array substrate comprising the thin film transistor of claim 1.

7. A display device comprising the array substrate of claim 6.

8. A fabricating method of a thin film transistor, comprising:
   forming a heavily doped first semiconductor pattern on a substrate, having an opening;
   forming a second semiconductor layer comprising uncrystallized second semiconductor pattern disposed on the heavily doped first semiconductor pattern and a crystallized portion filling the opening, the second semiconductor layer having a surface comprising a recess at the crystalized portion;

forming a gate insulating layer covering the second semiconductor pattern;

forming a gate pattern on the gate insulating layer, an orthographic projection of the gate pattern on the substrate being within an orthographic projection of the opening on the substrate, the gate pattern has a cross section of an inverted trapezoid including a lower base close to the gate insulating layer and an upper base away from the gate insulating layer, and the upper base is longer than the lower base;

forming a first via and a second via on two sides of the gate pattern, respectively, wherein the first via and the second via are disposed to penetrate, the gate insulating layer and the second semiconductor pattern, and extend to the heavily doped first semiconductor pattern;

forming a source pattern and a drain pattern, the source pattern and the drain pattern being in contact with the heavily doped first semiconductor pattern through the first via and the second via, respectively, wherein the first semiconductor pattern includes dents, a depth of each of the dents is less than a thickness of the first semiconductor pattern, and the source pattern and the drain pattern fill the dents.

9. The fabricating method of claim 8, wherein said forming the heavily doped first semiconductor pattern, and said forming the second semiconductor pattern comprise:

forming a first semiconductor layer on the substrate;

heavily doping the first semiconductor layer;

forming the opening at a predetermined location of the first semiconductor layer to form the heavily doped first semiconductor pattern;

forming the second semiconductor layer on the heavily doped first semiconductor pattern, wherein the second semiconductor layer covers the opening;

crystallizing a portion of the second semiconductor layer located at the opening; and forming the second semiconductor pattern by an uncrystallized portion of the second semiconductor layer.

10. The fabricating method of claim 8, wherein said forming the heavily doped first semiconductor pattern, and said forming the second semiconductor pattern comprise:

forming a first semiconductor layer on the substrate;

forming the opening at a predetermined location of the first semiconductor layer to form a first semiconductor pattern;

heavily doping the first semiconductor pattern to form the heavily doped first semiconductor pattern;

forming a second semiconductor layer on the heavily doped first semiconductor pattern, wherein the second semiconductor layer covers the opening;

crystallizing a portion of the second semiconductor layer located at the opening, and forming the second semiconductor pattern by an uncrystallized portion of the second semiconductor layer.

11. The fabricating method of claim 9, wherein before said forming the first semiconductor layer on the substrate, the fabricating method further comprises:

forming a buffer layer on the substrate.

12. The fabricating method of claim 8, wherein before said forming the first via and the second via on two sides of the gate pattern, respectively, the fabricating method further comprises:

forming a dielectric layer covering the gate pattern, wherein said forming a source pattern and a drain pattern comprises: forming the source pattern and the drain pattern on the dielectric layer.

13. The fabricating method of claim 8, wherein a material of the heavily doped first semiconductor pattern comprises polysilicon, a material of the second semiconductor pattern comprises amorphous silicon.

14. The fabricating method of claim 8, wherein the opening has a length of 2-3 μm.

* * * * *